(12) United States Patent
Yasuzato (10) Patent No.: US 7,955,761 B2
(45) Date of Patent: Jun. 7, 2011

(54) EXPOSURE MASK, PATTERN FORMATION METHOD, AND EXPOSURE MASK FABRICATION METHOD

(75) Inventor: Tadao Yasuzato, Tokyo (JP)

(73) Assignee: Elpida Memory, Inc, Tokyo (JP)

( * ) Notice: Subject to any disclaimer, the term of this patent is extended or adjusted under 35 U.S.C. 154(b) by 275 days.

(21) Appl. No.: 12/212,843

(22) Filed: Sep. 18, 2008

(65) Prior Publication Data

US 2009/0081564 A1  Mar. 26, 2009

(30) Foreign Application Priority Data

Sep. 25, 2007  (JP) ................................ 2007-246965

(51) Int. Cl.
*G03F 1/00* (2006.01)
*G03C 5/00* (2006.01)
(52) U.S. Cl. .......................................... 430/5; 430/394
(58) Field of Classification Search .............. 430/5, 311, 430/394; 355/53
See application file for complete search history.

(56) References Cited

U.S. PATENT DOCUMENTS

| 5,677,755 | A  | * | 10/1997 | Oshida et al. .................... 355/53 |
| 6,420,094 | B1 | * | 7/2002 | Haruki et al. .................. 430/311 |
| 2002/0058188 | A1 | * | 5/2002 | Iwasaki et al. .................... 430/5 |
| 2003/0096177 | A1 | * | 5/2003 | Iwasaki .............................. 430/5 |
| 2005/0058912 | A1 | * | 3/2005 | Lin et al. ........................... 430/5 |
| 2006/0183035 | A1 | * | 8/2006 | Misaka .............................. 430/5 |

FOREIGN PATENT DOCUMENTS

| JP | 4-268714 | 9/1992 |
| JP | 7-183201 | 7/1995 |
| JP | 2000-19710 | 1/2000 |

* cited by examiner

*Primary Examiner* — Mark F Huff
*Assistant Examiner* — Rashid Alam
(74) *Attorney, Agent, or Firm* — Young & Thompson (57) ABSTRACT

An exposure mask has a rectangular pattern, an auxiliary pattern, a translucent region, and a shielding region. The rectangular pattern includes a transparent region having a dimension equal to or greater than a critical resolution of exposure light. The auxiliary pattern is arranged around the rectangular pattern and includes a transparent region having a dimension smaller than the critical resolution. The translucent region is arranged between the rectangular pattern and the auxiliary pattern for shifting a phase of light transmitted through the rectangular pattern and the auxiliary pattern to an opposite phase. The shielding region is arranged around the auxiliary pattern.

8 Claims, 12 Drawing Sheets

EXPOSURE MASK, PATTERN FORMATION METHOD, AND EXPOSURE MASK FABRICATION METHOD

This application is based upon and claims the benefit of priority from Japanese patent application No. 2007-246965, filed on Sep. 25, 2007, the disclosure of which is incorporated herein in its entirety by reference.

BACKGROUND OF THE INVENTION

1. Field of the Invention

The present invention relates to an exposure mask, a pattern formation method, and an exposure mask fabrication method.

2. Description of the Related Art

In currently available exposure processes for semiconductor devices, an oblique incidence illumination method is employed to ensure a sufficient focal depth for dense patterns such as line-and-space patterns. Stable formation is thus ensured for patterns with considerably fine dimensions as long as they are cyclic patterns such as DRAM gate patterns or wiring patterns. The oblique incidence illumination method is a method in which a normal incidence component is cut from mask illumination light so that a mask is illuminated with oblique incident light. An ordinary illumination method forms a three-beam interference image by focusing three beams including zero-order diffracted light and positive and negative first-order diffracted light from a mask pattern by means of a projection lens. In contrast, the oblique-incidence illumination method forms a two-beam interference image by cutting off one of positive and negative first-order diffracted light components to obtain an image with two beams consisting of zero-order light and the other one of the positive and negative first-order diffracted light components.

Comparing the three-beam interference image formation with the two-beam interference image formation in terms of best focus, the two-beam interference image formation is inferior in terms of contrast since one of positive and negative first-order diffracted light components is cut off. However, when taking into consideration an incidence angle on a semiconductor substrate serving as an image formation plane, the incidence angle in the two-beam interference image formation is a half that in the three-beam interference image formation. Therefore, in the two-beam interference image formation, the degree of image blurring due to defocusing is reduced by that much, and it is made possible to obtain sufficient light intensity distribution for formation of a resist pattern in a wide focal range. Restrictions on the direction and angle of light illuminating a mask are provided by a secondary light source formed by a fly's eye lens having a metallic aperture following an exit of a light source. This is because the original light source, which is typically a mercury lamp or an excimer laser device, cannot illuminate the mask with uniform intensity by itself. To solve this problem, the mask is illuminated with the fly's eye lens which forms an aggregate of several hundreds of point light sources.

When viewing the optical illumination system from the mask side, only the aggregate of the spot light sources formed by the fly's eye lens can be seen and hence exposure characteristics are determined by the shape of the aggregate of the spot light sources. Accordingly, the original light source such as a mercury lamp is referred to as the primary light source, and the aggregate of spot light sources formed by the fly's eye lens is referred to as the secondary light source (effective light source). Additionally, a condenser lens is arranged between the secondary light source and the mask, whereby light from a central portion of the secondary light source is made incident vertically to the mask, while light from the outer peripheral portion of the secondary light source is made incident obliquely to the mask. Therefore, the oblique incidence illumination method employs an aperture which shields light from the central portion of the secondary light source or opens allowing only the light from the outer peripheral portion. The exposure characteristics on a wafer vary depending on this aperture shape (secondary light source shape), and secondary light sources having shapes as shown in FIGS. 1A to 1C have been proposed.

Figure 1A:
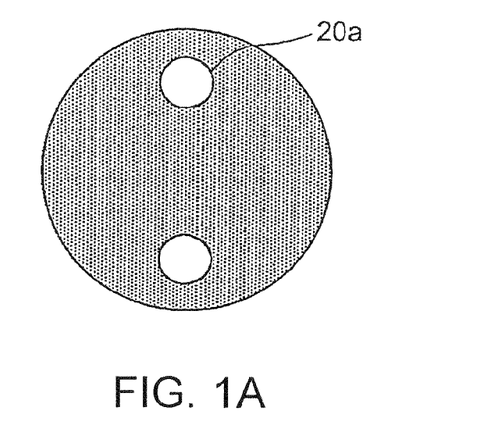
FIG. 1A is a plan view of a pupil plane showing an example of a typical oblique-incidence illumination.

An illumination shown in FIG. 1A is referred to as a two-point illumination. A secondary light source $20a$ having a shape as shown in FIG. 1A provides an effect of improving the focal depth of a one-direction pattern (herein, a horizontal-direction pattern).

Figure 1B:
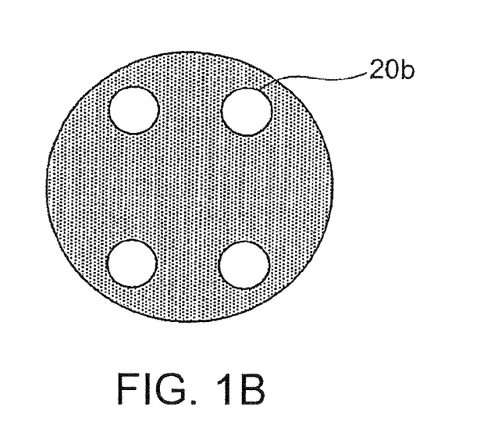
FIG. 1B is a plan view of a pupil plane showing another example of a typical oblique-incidence illumination.

An illumination shown in FIG. 1B is referred to as a four-point illumination. A secondary light source $20b$ having a shape as shown in FIG. 1B provides an effect of improving the focal depth of a two-direction (vertical and horizontal) pattern. Using the four-point illumination, the exposure characteristics of the vertical and horizontal pattern will be the same in the vertical and horizontal directions as long as the light source is located in the direction of 45/135 degrees. If the light source is deviated from this direction, the exposure characteristics will be different between the vertical and horizontal directions. For example, if the pitch in the vertical direction is relatively dense while the pitch in the horizontal direction is relatively sparse, in the example shown in FIG. 1B, the secondary light source assumes such a shape that the outermost periphery of the secondary light source is open in the vertical direction, while the inside of the outermost periphery is open in the horizontal direction.

Figure 1C:
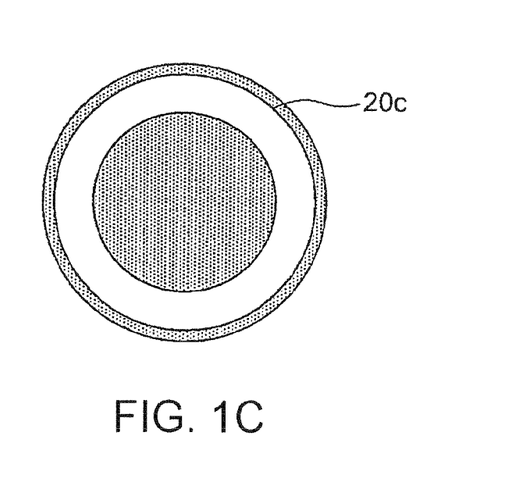
FIG. 1C is a plan view of a pupil plane showing still another example of a typical oblique-incidence illumination.

An illumination shown in FIG. 1C is referred to as an orbicular zone illumination. A secondary light source $20c$ having a shape as shown in FIG. 1C provides high versatility since the exposure characteristics have no dependency on pattern directions. Therefore, the orbicular zone illumination is employed in general, and if sufficient focal depth cannot be obtained with the orbicular zone illumination, then possibility of employment of the four-point illumination or two-point illumination applicable to limited patterns is studied.

There have also been proposed illumination methods for improving the exposure characteristics by utilizing polarization instead of the shape of the secondary light source. For example, Japanese Laid-Open Patent Publication No. H07-183201 (Patent Document 1) discloses a method for improving the exposure characteristics of a pattern in a specific direction by polarizing exposure light so as to be TE polarized light in the specific direction pattern even when the orbicular zone illumination is employed.

It is known that the focal depth can be enlarged further by the use of a halftone phase shift mask. The term "focal depth" refers to a focal range in which an effective resist pattern can be obtained. The term "halftone phase shift mask" refers to a phase shift mask that is obtained by forming a mask pattern functioning as a shielding region to be a translucent region so as to allow about 2 to 20% light to leak through, and inverting the phase by 180 degrees between the leaked light and light from a peripheral transparent region. If the pattern is a line-and-space pattern generating diffracted light, the use of a halftone mask together with the oblique incidence illumination method, the balance between the zero-order diffracted light and positive first-order (or negative first-order) diffracted light is improved, resulting in improvement in contrast.

As for an isolated pattern generating no diffracted light, however, the deformation illumination method described above does not have significant effect and the focal depth is not enlarged so much. The focal depth of the isolated pattern can be enlarged more effectively by reduction of numerical aperture (NA) or reduction of coherence factor (σ). The coherence factor σ refers to a ratio of size of an illumination lens to a size of a pupil plane of a light source. This means that σ is equal to a quotient obtained by dividing NA of an illumination lens by NA of a projection lens. The coherence factor σ is one when the size of the illumination lens is the same as the size of the pupil plane of the projection lens. Reduction of NA in an optical illumination system means that a mask is illuminated only with a substantially vertical light component. The focal depth can be improved more by illumination with low σ also when a halftone phase shift mask is used. All these conditions for enlarging the focal depth of an isolated pattern may lead to deterioration of resolution of a dense pattern. This makes it difficult to achieve favorable exposure characteristics both for a dense fine patterns and an isolated pattern.

In order to solve this problem and to provide a method capable of achieving improved focal depth both for a dense pattern and an isolated pattern, there has been studied a method of using a so-called auxiliary pattern, a fine pattern not resolved in itself. Such an auxiliary pattern is described for example in Japanese Laid-Open Patent Publication No. H04-268714 (Patent Document 2). Patent Document 2 employs a method of improving the focal depth of a pattern, according to which when a mask is illuminated with oblique incident light, an auxiliary pattern having a dimension smaller than a critical resolution is arranged in the vicinity of the pattern while aligning the angle and direction of the auxiliary pattern with those of the oblique incident light. By using the mask having the auxiliary pattern arranged as described above under the oblique-incidence illumination condition, the image formation condition approaches the two-beam interference image formation and thus the focal depth is enlarged.

The position and dimensions of the arranged auxiliary pattern affect the focal depth of a device pattern. While an optimal value for an interval between the auxiliary pattern and the main pattern differs depending on their dimensions and optical conditions used, the optimal value falls within a range of about 1.5 times of a critical resolution of the optical conditions. Although the effect of enlarging the focal depth of the main pattern becomes higher as the dimension of the auxiliary pattern is increased, the auxiliary pattern itself will be transferred onto a wafer if the dimension thereof is too great. Therefore, the size of the auxiliary pattern is set slightly smaller to allow some margin than the limit of size not causing the auxiliary pattern to be transferred onto the wafer.

A rule-based method and a model-based method have been proposed as a method of arranging an auxiliary pattern. The rule-based method is a method in which a table for designing a mask pattern is preliminarily prepared according to intervals between a main pattern and a pattern next to the same. According to the rule-based method, an auxiliary pattern is arranged for each of all the main patterns according to a rule, and then any problems in the auxiliary patterns such as insufficient spacing between the auxiliary pattern and the main pattern or insufficient spacing between the auxiliary patterns. The rule-based method has an advantage that the auxiliary pattern can be generated and checked rapidly. In addition, since the arrangement rule is preliminarily prepared, the result can be checked easily by using design rule check (DRC).

The model-based method is a method in which simulation is performed to find a value of contrast or focal depth, and an auxiliary pattern is generated if the value is insufficient. The model-based method has an advantage that the auxiliary pattern can be arranged to ensure sufficient exposure characteristics.

On the other hand, there have also been proposed halftone phase shift masks having a shielding region in addition to a transparent region and a translucent region. Such masks are also referred to as tritone masks, and those of rim type having a translucent region only in the vicinity of a hole pattern are well known. Japanese Laid-Open Patent Publication No. 2000-19710 (Patent Document 3) discloses a tritone mask having a translucent region of an opposite phase in the vicinity of a hole pattern, an octagonal translucent region of the same phase formed around the translucent region, and a shielding region formed around the outer periphery of the translucent region. Using the tritone mask, the focal depth can be enlarged since the amplitude distribution of mask transmitted light is allowed to have pseudo periodicity by using the translucent region and shielding region having the same phase.

SUMMARY

Miniaturization is an essential requirement for cost reduction in general purpose memories such as DRAMs, and thus the pitch of memory cell arrays has been reduced to resolution limit of exposure devices. Therefore, illumination conditions of exposure devices have become set to oblique-incidence illumination exclusively for memory cell arrays. However, this poses a problem that the focal depth is reduced in patterns with a relatively large pitch outside of the miniaturized memory cell arrays.

Further, when an auxiliary pattern is arranged in a mask to surround a main pattern, the auxiliary pattern will inevitably include an oblique pattern. When mask drawing is performed for such a mask with the use of a mask drawing device employing a variable rectangular beam which is primarily used at present, the oblique pattern must be drawn by using a fine rectangle of the variable rectangular beam, posing a problem that a lot of time is required for the drawing.

Furthermore, in a fabrication process of the tritone mask described above, the translucent region is drawn after drawing the transparent region. This means that the mask drawing using the variable rectangular beam is performed twice. Therefore, there is a problem that positional accuracy of a pattern transferred onto a wafer will be deteriorated unless the second mask drawing for forming the translucent region is registered at high precision with the first mask drawing.

The present invention seeks to solve one or more of the above problems, or to improve upon those problems at least in part.

In one embodiment, there is provided an exposure mask that includes a rectangular pattern, an auxiliary pattern, a translucent region, and a shielding region. The rectangular pattern includes a transparent region having a dimension equal to or greater than a critical resolution of exposure light. The auxiliary pattern is arranged around the rectangular pattern and includes a transparent region having a dimension smaller than the critical resolution. The translucent region is arranged between the rectangular pattern and the auxiliary pattern for shifting a phase of light transmitted through the rectangular pattern and the auxiliary pattern to an opposite phase. The shielding region is arranged around the auxiliary pattern.

BRIEF DESCRIPTION OF THE DRAWING

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Exemplary embodiments of the present invention will be described with reference to the accompanying drawings.

Figure 2:
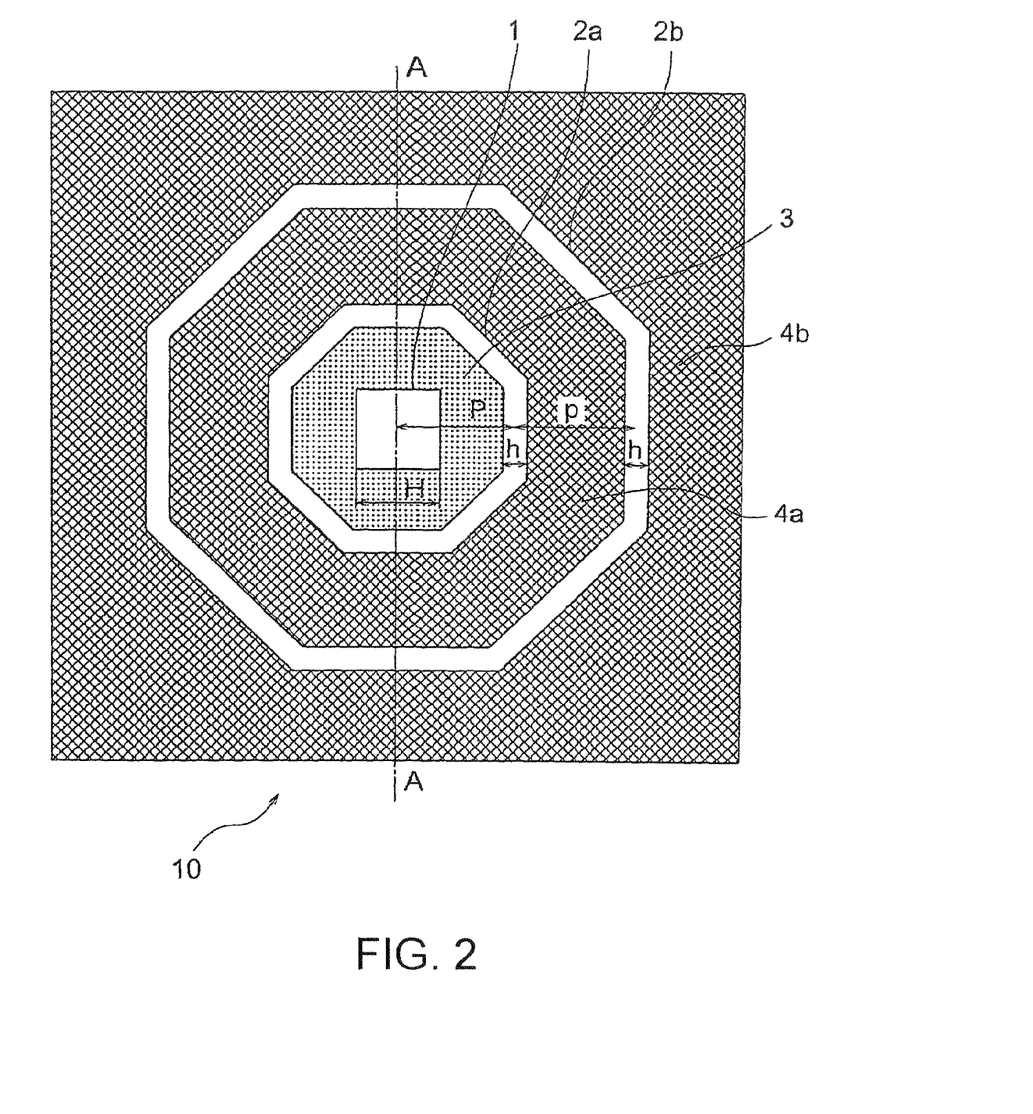
FIG. 2 is a plan view showing an exposure mask according to an embodiment of the present invention.

FIG. 2 is a plan view of an exposure mask according to an exemplary embodiment of the present invention. Description will be made in terms of an exposure mask (hereafter referred to simply as the "mask") which is used in an exposure process for forming on a wafer (not shown) an isolated pattern having a dimension of 70 nm and generating no diffracted light. The mask 10 is a halftone phase shift mask (with a transmittance of 12%) having a hole pattern 1, auxiliary patterns 2a and 2b, a halftone region 3, and shielding regions 4a and 4b.

The hole pattern 1 is, for example, of a square shape having a dimension equal to or greater than a critical resolution of exposure light (H=96 nm). The auxiliary patterns 2a and 2b are octagonal in shape and arranged to surround the hole pattern 1. Each of the auxiliary patterns 2a and 2b has a dimension smaller than the critical resolution of the exposure light (h=26 nm). A pitch P between the center of the hole pattern 1 and the center of the width h of the auxiliary pattern 2a, and a pitch p between the auxiliary pattern 2a and the auxiliary pattern 2b are both set to 140 nm.

The halftone region 3 having a transmittance of 12% is arranged between the hole pattern 1 and the auxiliary pattern 2a. Mask transmitted light, which has been transmitted through the halftone region 3, has its phase inverted 180 degrees with respect to mask transmitted light passing through the hole pattern 1. The shielding region 4a is arranged between the auxiliary pattern 2a and the auxiliary pattern 2b. The shielding region 4b is arranged around the outer periphery of the auxiliary pattern 2b. The shielding regions 4a and 4b have a transmittance of 0.1% or less and they shield exposure light to such an extent that the light intensity distribution on the wafer is not affected thereby. As described above, the mask 10 has not only the transparent regions provided by the hole pattern 1 and the auxiliary patterns 2a and 2b and the translucent region provided by the halftone region 3, but also the shielding regions 4a and 4b, and thus forms a so-called tritone mask.

Figure 3A:
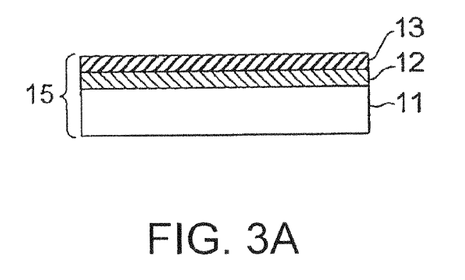
FIG. 3A is a process chart showing one of exposure mask fabrication steps.
Figure 3B:
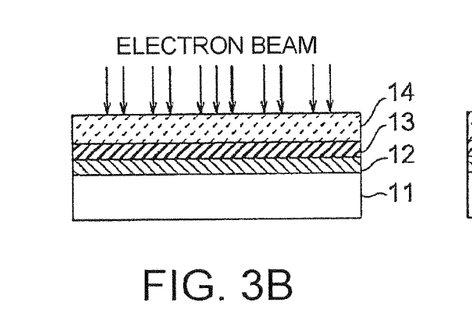
FIG. 3B is a process chart showing subsequent one of the exposure mask fabrication steps.
Figure 3C:
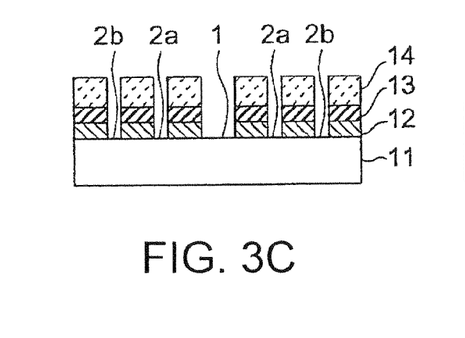
FIG. 3C is a process chart showing a subsequent one of the exposure mask fabrication steps.
Figure 3D:
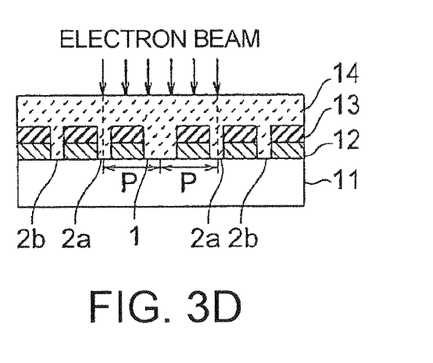
FIG. 3D is a process chart showing a subsequent one of the exposure mask fabrication steps.
Figure 3E:
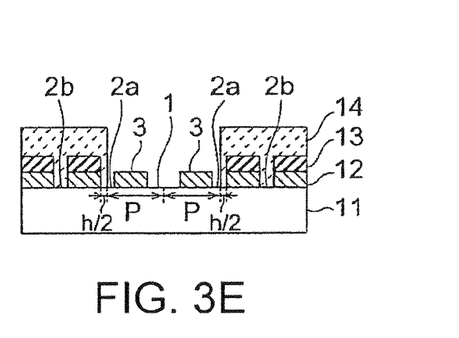
FIG. 3E is a process chart showing a subsequent one of the exposure mask fabrication steps.
Figure 3F:
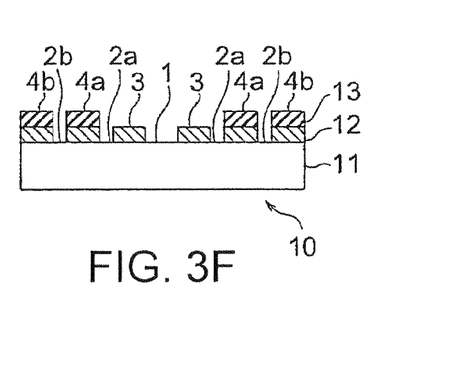
FIG. 3F is a process chart showing a subsequent one of the exposure mask fabrication steps.

FIGS. 3A to 3F are process charts showing principal steps for fabricating the mask 10. FIG. 3F is a cross-sectional view of the mask 10 of FIG. 2, taking along the line A-A.

The principal fabrication steps of the mask 10 will described with reference to FIGS. 3A to 3F.

First, as shown in FIG. 3A, a mask substrate 15 is prepared. The mask substrate 15 is composed of a transparent substrate 11 having a halftone film (translucent film) 12 and a shielding film 13 formed thereon in this order. The transparent substrate 11 is usually made of a synthetic silica ($SiO_2$).

The halftone film 12 and the shielding film 13 are most typically made of MoSiON and chromium, respectively. The top surface of the shielding film 13 is covered with chromium oxide for an anti-reflection purpose.

Subsequently, as shown in FIG. 3B, a positive resist 14 is applied to the mask substrate 15, and first mask drawing is performed. In this process, the hole pattern 1 as the transparent region and the auxiliary patterns 2a and 2b are drawn. A mask drawing device performs electron-beam drawing while adjusting the range of a variable rectangular beam (hereafter, referred to as the "electron beam") based on drawing data (to be described later) stored in a hard disc, for example.

The drawing data is data obtained by correcting any dimensional shift due to process bias. The dimensional shift due to process bias is principally caused by regression of the resist during dry etching of the shielding film 13. For example, if it is assumed that a dimensional shift of 10 nm has occurred both in the hole pattern 1 and the auxiliary patterns 2a and 2b, the electron-beam drawing is performed using the drawing data that has been corrected to a slightly smaller range than a target mask pattern (i.e. H=96 nm, h=26 nm) with a bias of −10 nm.

Subsequently, after development, as shown in FIG. 3C, the shielding film 13 is dry-etched with chlorine gas and then the translucent film 12 is dry-etched with fluorine gas, whereby the hole pattern 1 and the auxiliary patterns 2a and 2b are formed. During the dry etching process using chlorine gas, as described above, the resist 14 is also etched, which causes dimensional shift. This means that the dimension is enlarged. As a result of this process, the hole pattern 1 and the auxiliary patterns 2a and 2b are formed with the target dimensions. After this process, the resist 14 is removed and the resultant structure is washed and checked for dimensions and defects.

If no problem is found in these checks, the resist 14 is applied again as shown in FIG. 3D, and second mask drawing is performed. In this process, a pattern of the halftone region 3 is drawn. The range of the electron beam is adjusted during this process by the mask drawing device so as to fall in a range containing the pitch P, that is, in a range extending from the center of the hole pattern 1 to the center line of the auxiliary pattern 2a with an octagonal shape (the line passing the center of the width h).

Subsequently, as shown in FIG. 3E, an etching process is performed after development to remove the shielding film 13 between the hole pattern 1 and the auxiliary pattern 2a. As described above, an electron beam used for the second mask drawing is applied to a region containing a part of the auxiliary pattern 2a corresponding to a half the width on the side of the halftone region 3. Therefore, the resist 14 is left unremoved on the part of the auxiliary pattern 2a which is not irradiated with the electron beam, that is, the part corresponding to a half the width h on the side of the shielding region 4a.

Subsequently, as shown in FIG. 3F, the mask 10 is fabricated by selectively dry etching the shielding film 13, the translucent film 12 or the transparent substrate 11 with the use of chlorine gas.

In this fabrication process of the mask 10, the part of the auxiliary pattern 2a not irradiated with the electron beam during the second mask drawing functions as a margin. This means that the arrangement of the auxiliary pattern 2a between the shielding region 4a and the halftone region 3 makes it possible to form the halftone region 3 having a substantially uniform width around the hole pattern 1 even if the range of the electron beam during the second mask drawing is deviated in position by the extent of the margin. In the fabrication of the mask 10, the presence of this margin eliminates the need of high positional precision or high dimensional precision during the second mask drawing, as well as the need of taking process bias into consideration. Therefore, according to the fabrication process of the mask 10, high precision is not required for registration in the second mask drawing, namely, for adjustment of the electron beam range, and the registration precision of the second mask drawing does not adversely affect the positional accuracy of the transferred patterns on the wafer.

Figure 4:
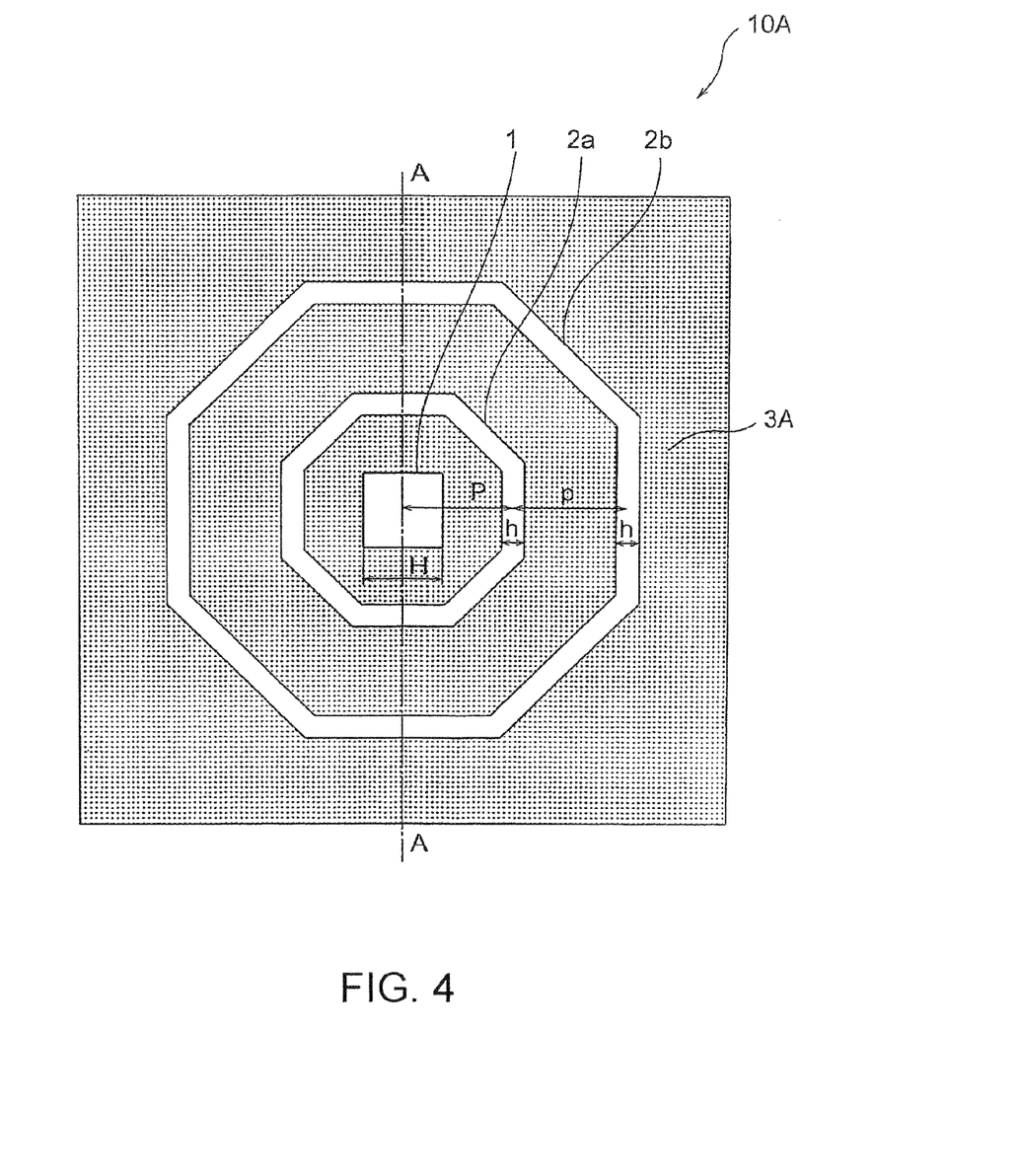
FIG. 4 is a plan view showing a halftone phase shift mask as a comparative example.

FIG. 4 is a plan view showing a halftone phase shift mask as a comparative example. The mask 10A, being a halftone phase shift mask, is also for forming on a wafer an isolated pattern with a dimension of 70 nm in the same manner as the mask 10. The mask 10A has a hole pattern 1 and auxiliary patterns 2a and 2b as transparent regions, and a halftone region 3A as a translucent region. The pitch P between the center of the hole pattern 1 and the center of the auxiliary pattern 2a and the pitch p between the centers of the auxiliary patterns 2a and 2b are both set to 140 nm as in the mask 10.

Advantageous effects of the mask 10 according to the embodiment of the invention will be described while comparing the mask 10 with the mask 10A as the comparative example. As a prerequisite for comparing the mask 10 and the mask 10A in terms of the focal depth, the auxiliary patterns 2a and 2b of both the masks must have substantially same transfer property. This is because when a mask is provided with an auxiliary pattern, the focal depth of the mask is significantly affected by the size of the auxiliary pattern. For example, if the dimension h of the auxiliary patterns 2a and 2b is increased regardless of the transfer property of the auxiliary patterns 2a and 2b, the focal depth will be enlarged by that much. The transfer property of the auxiliary patterns 2a and 2b is a value quantifying whether the pattern is transferable onto the wafer, and obtained by dividing a maximum light intensity of the auxiliary pattern by a light intensity at which a target dimension is obtained. The target dimension here is a dimension of 70 nm of the isolated pattern formed on the wafer. As the value indicating the transfer property of the auxiliary pattern 2a and 2b becomes smaller, it indicates that the pattern is less transferable, whereas as the value becomes closer to one, it indicates that the pattern is more transferable. For example, if the value is 0.7 or less, the auxiliary patterns 2a and 2b will not be transferred onto the wafer.

This means that it is meaningless to compare the focal depths of the masks 10 and 10A, unless the transfer properties of the auxiliary patterns 2a and 2b of the these masks are made substantially the same by appropriately setting the dimension h of the auxiliary patterns 2a and 2b and the dimension H of the hole pattern 1.

Tables 1 and 2 below therefore show dimensions H and h of the masks 10 and 10A determined in consideration of the transfer property of the auxiliary patterns 2a and 2b, in association with transmittance of the halftone regions 3 and 3A. Additionally, calculation was made for the light intensity of mask transmitted light obtained by irradiating the masks 10 and 10A shown in Table 1 and 2 with the use of an exposure device to be described later, and calculation results are shown in FIGS. 6 and 7, and FIGS. 9 to 11, respectively. It is confirmed, from these results, that the auxiliary patterns 2a and 2b of the masks 10 and 10A have substantially same transfer properties.

Table 1 shows the dimensions H and h when the transmittance of the halftone region 3 of the mask 10 of the embodiment of the invention is 6%, 12%, and 20%, respectively. As seen from Table 1, when the transmittance is 12%, the mask 10 shown in FIG. 2 has the hole pattern 1 with a dimension H of 96 nm and the auxiliary patterns 2a and 2b with a dimension h of 26 nm.

TABLE 1

| Transmittance of halftone region (%) | H (nm) | h (nm) |
|---|---|---|
| 6 | 90 | 24 |
| 12 | 96 | 26 |
| 20 | 102 | 28 |

Table 2 shows the dimensions H and h when the transmittance of the halftone region 3A of the mask 10A of the comparative example shown in FIG. 4 is 0%, 5%, and 12%, respectively As for the mask 10A, if the transmittance becomes higher than 12%, light leaked through other parts than the patterns will develop the resist. Therefore, in Table 2, the upper limit of the transmittance is set to 12%.

TABLE 2

| Transmittance of halftone region (%) | H (nm) | h (nm) |
|---|---|---|
| 0 | 80 | 24 |
| 6 | 106 | 50 |
| 12 | 140 | 70 |

Figure 5:
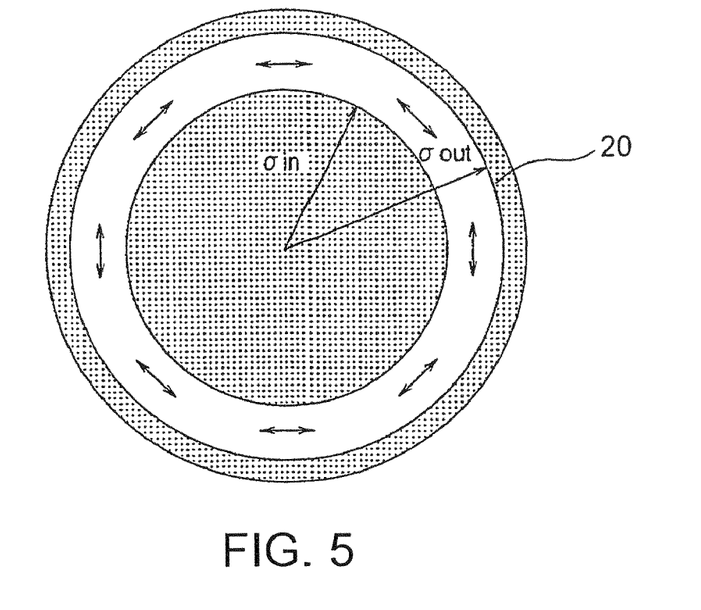
FIG. 5 is a plan view of a pupil plane showing an example of an orbicular zone illumination for illuminating an exposure mask with exposure light.

Description will be made of a case in which the masks 10 and 10A shown in Tables 1 and 2 are irradiated with exposure light. An exposure device of a step-and-scan type is used with a reduction ratio being set to 4. ArF laser with a wavelength λ of 193 nm is used while a numerical aperture (NA) is set to 0.90. As shown in FIG. 5, the illumination is performed in the form of orbicular zone illumination in which the outer periphery σout is 0.95, the inner periphery σ in is 0.665, and the shielding rate is 70%. Light from a light source portion 20 is polarized in a direction indicated by the arrow in FIG. 5. This means that exposure light obtained from the light source portion 20 forming the orbicular zone illumination is linearly polarized light. The polarization direction of this linearly polarized light is perpendicular to a radial direction of the aperture and referred to as the "azimuth polarization".

Figure 6:
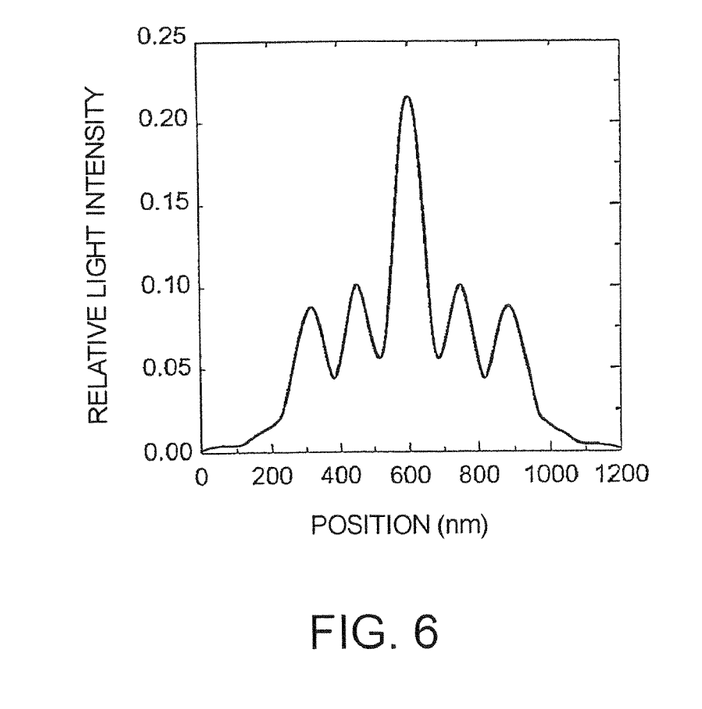
FIG. 6 is a diagram showing light intensity distribution when the exposure mask of FIG. 2 has a transmittance of 6%.
Figure 7:
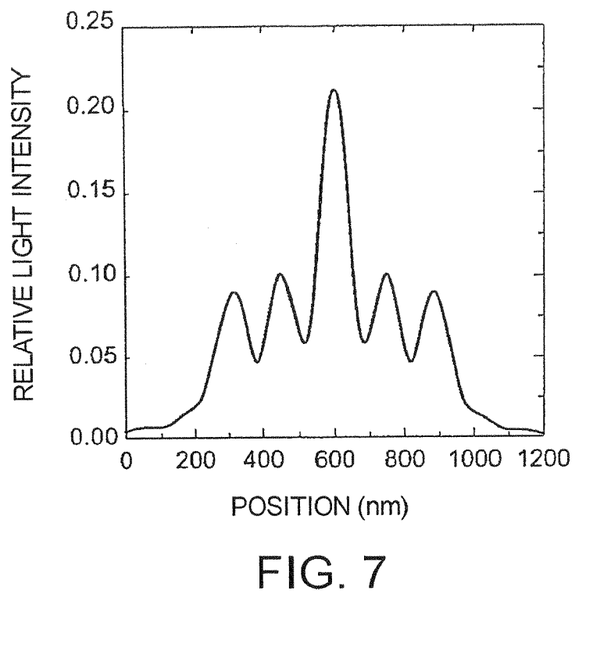
FIG. 7 is a diagram showing light intensity distribution when the exposure mask of FIG. 2 has a transmittance of 12%.
Figure 8:
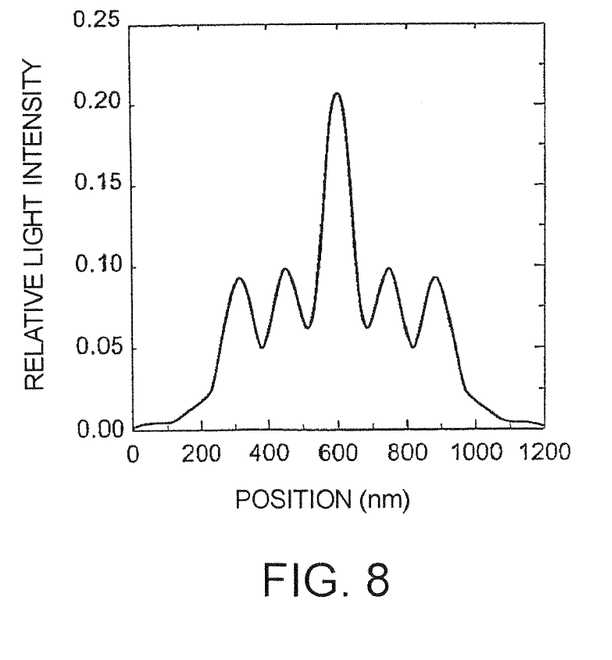
FIG. 8 is a diagram showing light intensity distribution when the exposure mask of FIG. 2 has a transmittance of 20%.

Referring to FIGS. 6 to 8, description will be made on light intensity distribution of the mask 10 according to the embodiment of the invention. FIG. 6 shows the light intensity distribution of the mask 10 having a transmittance of 6%, FIG. 7 shows that of the mask 10 having a transmittance of 12%, and FIG. 8 shows that of the mask 10 having a transmittance of 20%. Unless otherwise noted, the dimension values are those on the wafer. In the figures, the horizontal axis represents position on the line A-A of the mask 10 shown in FIG. 2, and the position 600 nm corresponds to the center of the hole pattern 1. The vertical axis represents relative light intensity. The relative light intensity is a value obtained by standardizing with light intensity of a sufficiently large aperture pattern. In this example, an exposure threshold model is applied on the assumption that the positive resist on the wafer will be dissolved if the relative light intensity is 0.15 or higher regardless of the transmittance of the mask.

In order to form an isolated pattern with the target dimension of 70 nm, the relative light intensity is set such that it assumes a value of 0.15 or higher regardless of the transmittance in a positional range of 600±35 nm (from 565 nm to 635 nm) since the center of the hole pattern 1 is at the position 600 nm and edges thereof should be taken into consideration.

The maximum light intensity at positions corresponding to the auxiliary patterns 2a and 2b is adjusted to about 0.1 at any one of the transmittances as shown in FIGS. 6 to 8. Thus, the transfer property of the auxiliary patterns 2a and 2b obtained by dividing the maximum light intensity of the auxiliary pattern by the light intensity at which the target dimension, that is, 0.1/0.15 is equal to 0.67 at any of the transmittances. Accordingly, since the transfer property is less than 0.7, the auxiliary patterns 2a and 2b will not be transferred onto the wafer.

Figure 9:
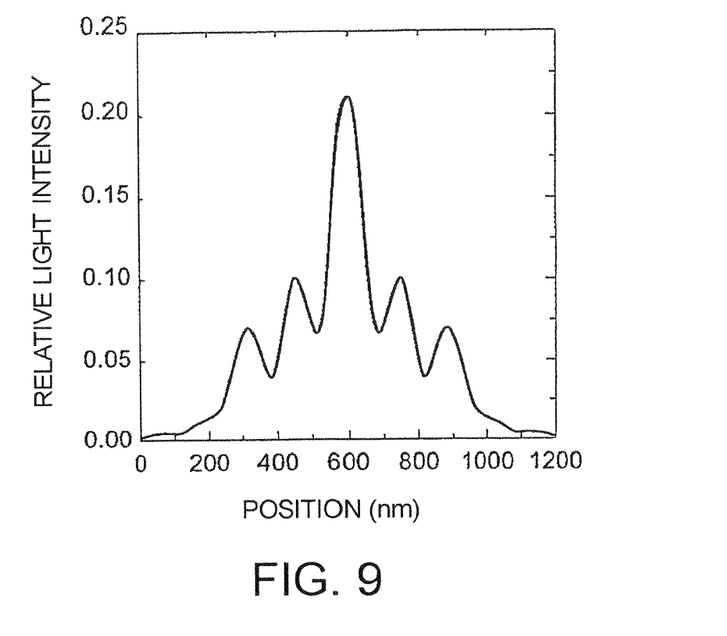
FIG. 9 is a diagram showing light intensity distribution when the exposure mask of FIG. 4 has a transmittance of 0%.
Figure 10:
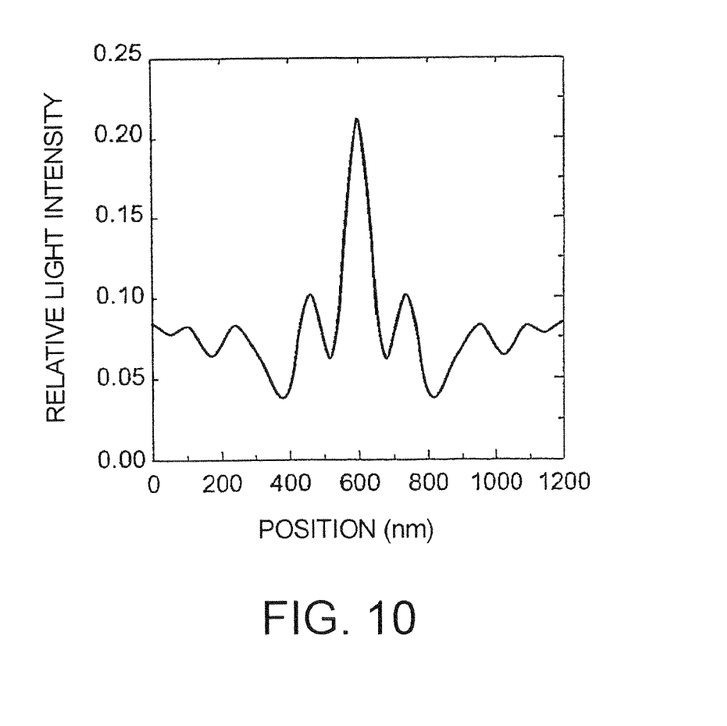
FIG. 10 is a diagram showing light intensity distribution when the exposure mask of FIG. 4 has a transmittance of 6%.
Figure 11:
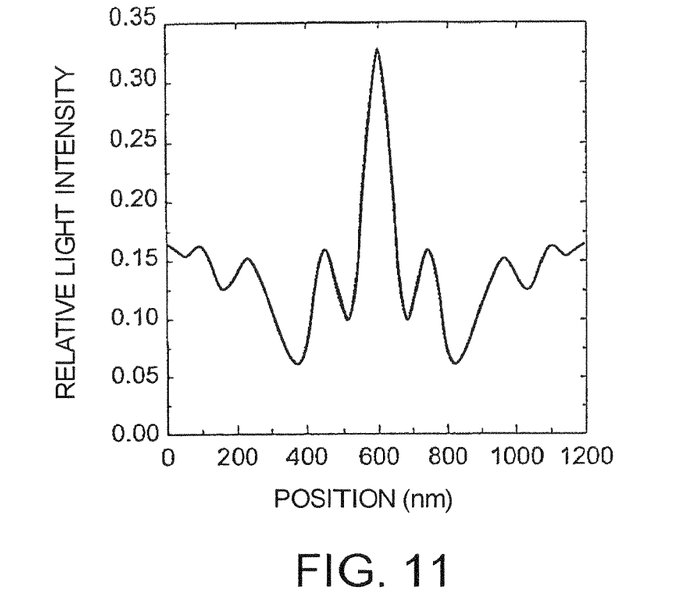
FIG. 11 is a diagram showing light intensity distribution when the exposure mask of FIG. 4 has a transmittance of 12%.

Referring to FIGS. 9 to 11, light intensity distribution of the mask 10A as the comparative example will be described. FIG. 9 shows the light intensity distribution of the mask 10A with a transmittance of 0%, FIG. 10 shows that of the mask 10A with a transmittance of 6%, and FIG. 11 shows that of the mask 10A with a transmittance of 12%. The horizontal axis represents position on the line A-A of the mask 10A shown in FIG. 4, and the vertical axis represents relative light intensity. In order to form an isolated pattern with the target dimension of 70 nm, the relative light intensity is set to a value of 0.15 or higher in a positional range of 565 nm to 635 nm for the mask 10A with a transmittance of 0% shown in FIG. 9 and the mask 10A with a transmittance of 6% shown in FIG. 10, and the maximum light intensity at the position corresponding to the auxiliary pattern 2a is set to about 0.1. This means that the transfer property of the auxiliary pattern 2a in the mask 10A shown in FIGS. 9 and 10 is also 0.67 as in the mask 10.

In the mask 10A with a transmittance of 12% shown in FIG. 11, the relative light intensity in the positional range of 565 nm to 635 nm is set to 0.23 or higher, and the maximum light intensity of the auxiliary pattern 2a is set to 0.15. As a result, the transfer property of the auxiliary pattern 2a is 0.15/0.23=0.65, substantially the same value as in the other cases.

Figure 12:
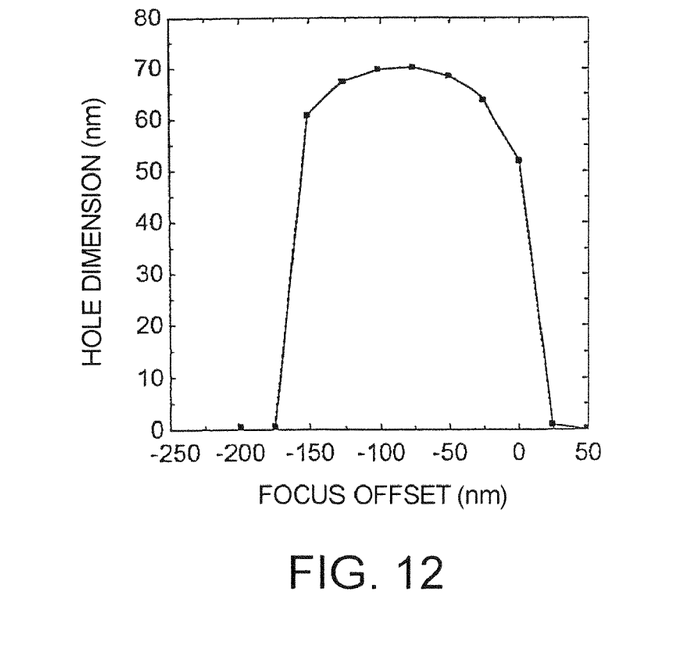
FIG. 12 is a diagram showing a relation between focus and hole dimension when the exposure mask of FIG. 2 has a transmittance of 6%.
Figure 13:
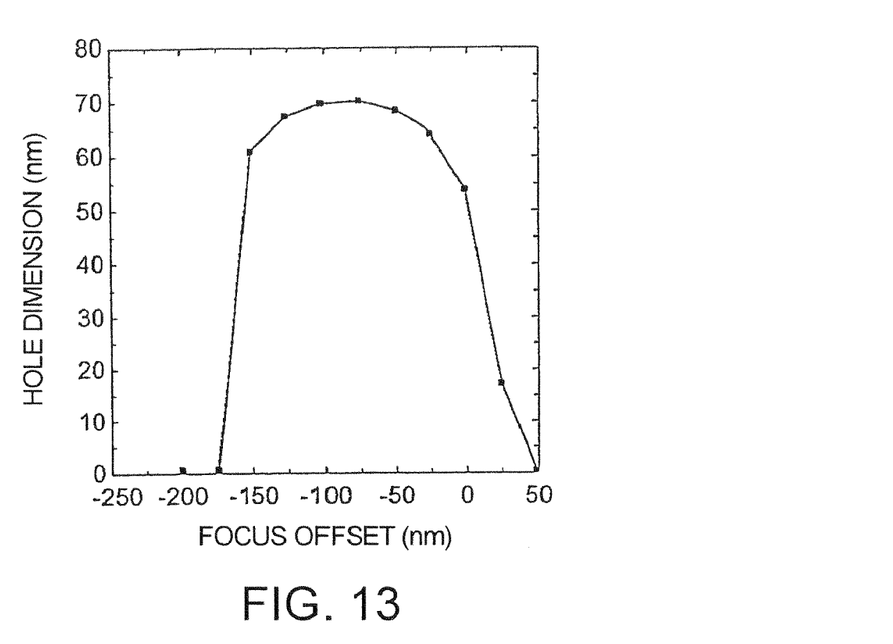
FIG. 13 is a diagram showing a relation between focus and hole dimension when the exposure mask of FIG. 2 has a transmittance of 12%.
Figure 14:
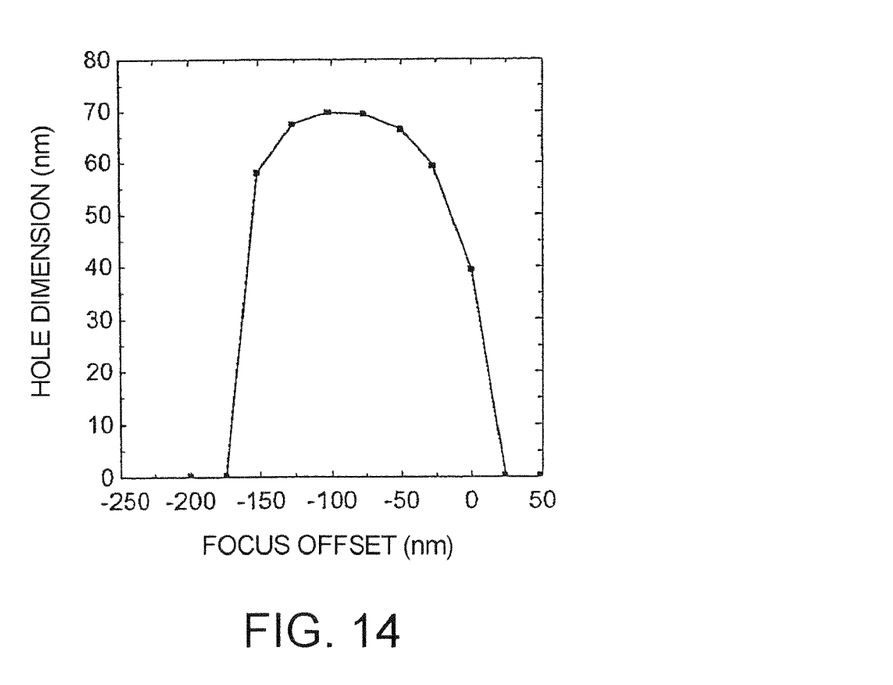
FIG. 14 is a diagram showing a relation between focus and hole dimension when the exposure mask of FIG. 2 has a transmittance of 20%.
Figure 15:
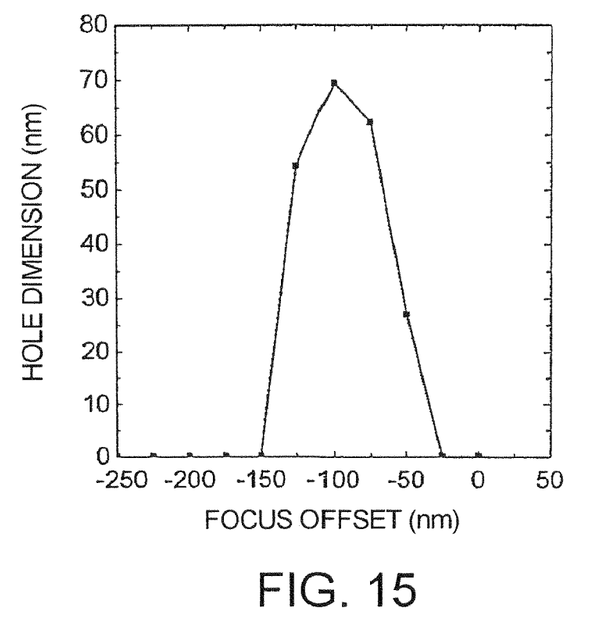
FIG. 15 is a diagram showing a relation between focus and hole dimension when the exposure mask of FIG. 4 has a transmittance of 0%.
Figure 16:
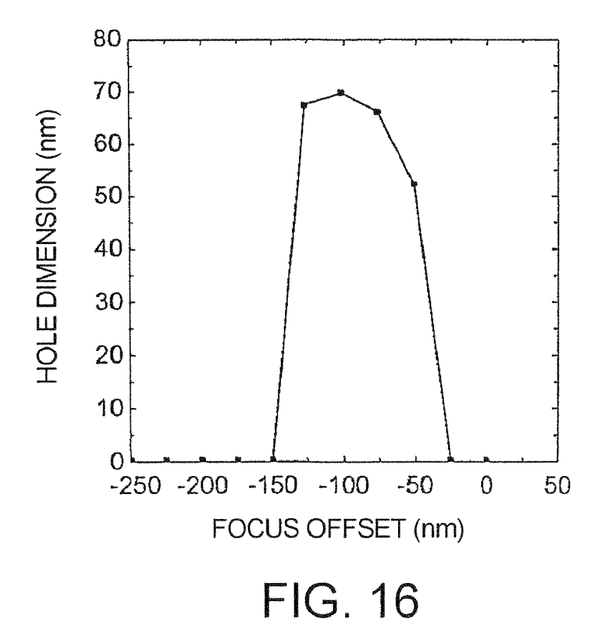
FIG. 16 is a diagram showing a relation between focus and hole dimension when the exposure mask of FIG. 4 has a transmittance of 6%.
Figure 17:
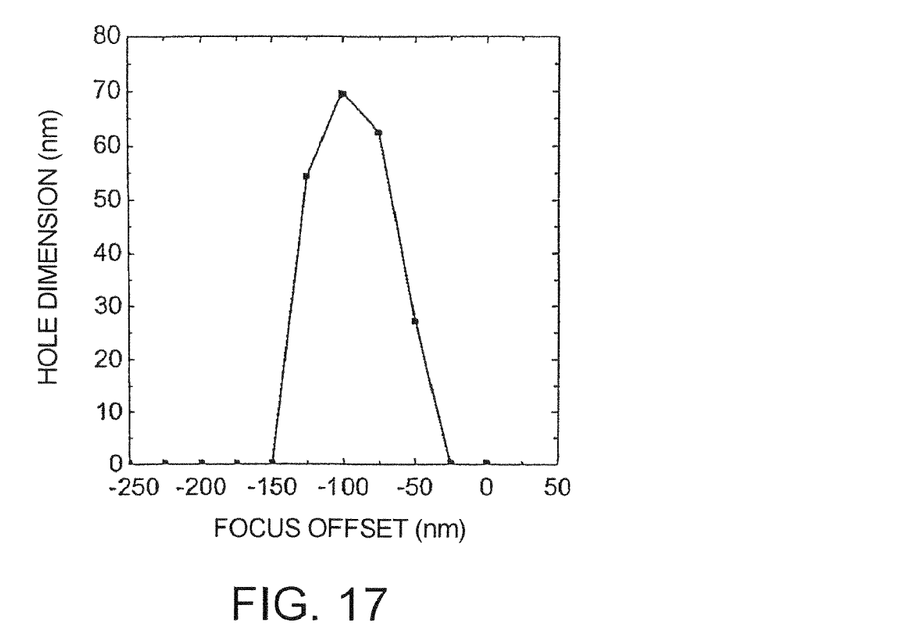
FIG. 17 is a diagram showing a relation between focus and hole dimension when the exposure mask of FIG. 4 has a transmittance of 12%.

It will be understood that the transfer properties of the auxiliary patterns are made substantially the same between the mask 10 of the embodiment and the mask 10A of the comparative example in order to compare the focal depths thereof. FIGS. 12 to 14 show relationship between focal depth and dimension of the transferred hole pattern 1 (referred to as hole dimension in the figures) in the mask 10. Further, FIGS. 15 to 17 show relationship between focal depth and hole dimension in the mask 10A as the comparative example.

FIGS. 12 to 14 show relationship between focus and hole dimension in the mask 10 according to the embodiment of the invention. FIG. 12 is for the mask 10 with the transmittance of 6%, FIG. 13 is for the mask 10 with the transmittance of 12%, and FIG. 14 is for the mask 10 with the transmittance of 20%. A wafer was used herein which had a structure in which a 100 nm thick anti-reflection film and a 350 nm thick resist were laminated on a silicon substrate. The horizontal axis in the figures represents focus offset (nm). The focus offset when the focal plane matches the surface of the resist is defined as 0 nm, and the direction in which the focal plane moves upwards is defined as positive focus offset. The exposure value was set such that an isolated pattern with the target dimension of 70 nm is opened when the focus offset is −100 nm. The focal depth was set in such a range that an isolated pattern having a dimension within ±20% from the target dimension 70 nm (from 56 nm to 84 nm) is opened. Calculation was performed on the assumption that the transmittance of the shielding regions 4a and 4b was 0%.

As a result, it was found that, as shown in FIGS. 12 to 14, the range of the focus offset was from −150 nm to −25 nm for any of the transmittances of the mask 10, and a relatively large focal depth, 125 nm was obtained. Further, variation of hole dimension with respect to focal depth was slightly smaller in the mask 10 with the transmittance of 12% shown in FIG. 13 than in the mask 10 with the transmittance of 6% or 20% shown in FIG. 12 or FIG. 14. Accordingly, the mask 10 with the transmittance of 12% makes it possible not only to obtain a large focal depth but also to more stably form an isolated pattern on the wafer.

It is therefore believed that the optimal transmittance is 12%. The optimal transmittance value varies depending on optical conditions and mask dimensions. In particular, the dimension H of the hole pattern 1 which is a rectangular pattern has a significant effect on the optimal transmittance value. For example, the optimal value becomes smaller if the dimension H is reduced, whereas it becomes greater if the dimension H is increased.

FIGS. 15 to 17 show relationship between focus and hole dimension in the mask 10A as the comparative example. FIG. 15 is for the mask 10A with the transmittance of 0%, FIG. 16 is for the mask 10A with the transmittance of 6%, and FIG. 17 is for the mask 10A with the transmittance of 12%. It was found that the maximum focal depth was obtained in the mask 10A with the transmittance of 6% shown in FIG. 16. In this case, however, the range of focus offset was from −125 nm to −75 nm, while the focal depth was only 50 nm, and not so large as the focal depth obtained in the mask 10 of the embodiment.

Consequently, the mask 10 according to the invention is able to improve the focal depth more than the mask 10A of the comparative example, by optimizing the transmittance for each of the hole pattern 1, the halftone region 3, the auxiliary pattern 2a, the shielding region 4a, the auxiliary pattern 2b, and the shielding region 4b around the outer periphery of the auxiliary pattern 2b.

It is believed that this is because there are arranged, in the mask 10, the hole pattern 1, the halftone region 3, the auxiliary pattern 2a, the shielding region 4a, the auxiliary pattern 2b, and the shielding region 4b in this order, and thus the transmittance varies along with the distance from the center of the hole pattern 1, whereby the amplitude distribution of mask transmitted light is approximated to the so-called Bessel function.

A drawing data generating method constituting a part of the fabrication method of the mask 10 according to the invention will be described with reference to FIGS. 18 to 20. Although the following description will only mention the hole pattern 1 and the auxiliary pattern 2a of the mask 10, drawing data is also generated for the auxiliary pattern 2b in the same manner as for the auxiliary pattern 2a. The auxiliary pattern 2a has an octagonal shape surrounding the hole pattern 1 by 180 degrees or more, which means that it inevitably contains an oblique pattern therein.

Figure 18:
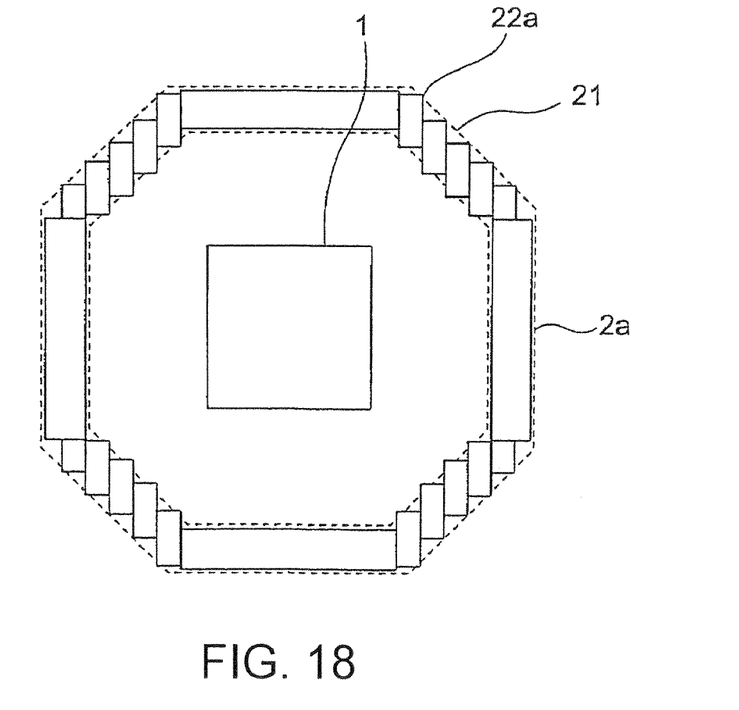
FIG. 18 is a plan view of a hole pattern and an auxiliary pattern for illustrating a drawing data generation method constituting a part of an exposure mask fabrication process according to the embodiment of the present invention.

For example, the auxiliary pattern 2a shown in FIG. 18 contains an oblique pattern 21. In the drawing data generating method of the embodiment of the invention, the oblique pattern 21 is approximated by a plurality of square patterns (rectangular patterns) 22a. Drawing data of this rectangular pattern 22a is generated in consideration of dimensional shift due to process bias. Further, the dimension of the rectangular pattern 22a is determined to be substantially the same as a critical resolution of the mask-drawn resist.

This makes it possible to draw the auxiliary pattern 2a containing the oblique pattern 21 without causing aliasing due to the rectangular patterns 22a in the mask 10 even if the accuracy of an electron beam emitted by a mask drawing device (now shown) is deteriorated or the resolution performance of the resist is degraded. Further, the approximation of the oblique pattern 21 by the plurality of rectangular patterns 22a instead of fine rectangles, the number of rectangles drawn during the mask drawing can be reduced, and hence the period of time required for the mask drawing can be shortened.

Figure 19:
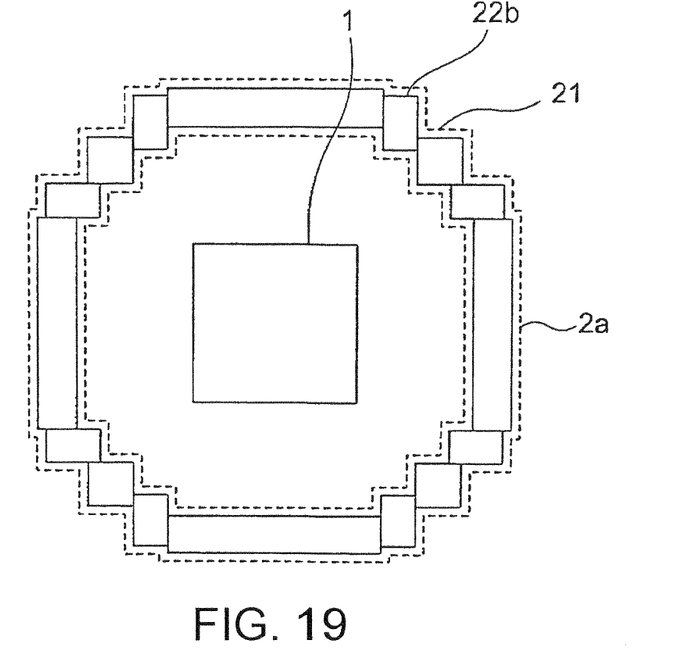
FIG. 19 is a plan view of a hole pattern and an auxiliary pattern for illustrating another drawing data generation method.

FIG. 19 shows an auxiliary pattern 2a approximated by another drawing data generation method. As shown in FIG. 19, an oblique pattern 21 contained in the auxiliary pattern 2a is approximated by rectangular patterns 22b which are greater in size than the rectangular patterns 22a. Even if the size of the rectangular patterns 22b is greater than a size corresponding to a critical resolution of mask-drawn resist to such an extent that aliasing is caused in the oblique pattern 21 during the mask drawing, the aliasing information is eliminated in light intensity distribution on the wafer by making the aliasing less than the critical resolution of an exposure device used for transferring the pattern on to the wafer. Thus, the same light intensity as in the oblique pattern 21 can be obtained.

According to the configuration as described above, even if aliasing is caused in the oblique pattern 21 of the mask 10, the aliasing is not reproduced when the pattern is transferred onto the wafer. Since the number of rectangles in the mask drawing can be reduced further, the time required for the mask drawing can be shortened further.

Figure 20:
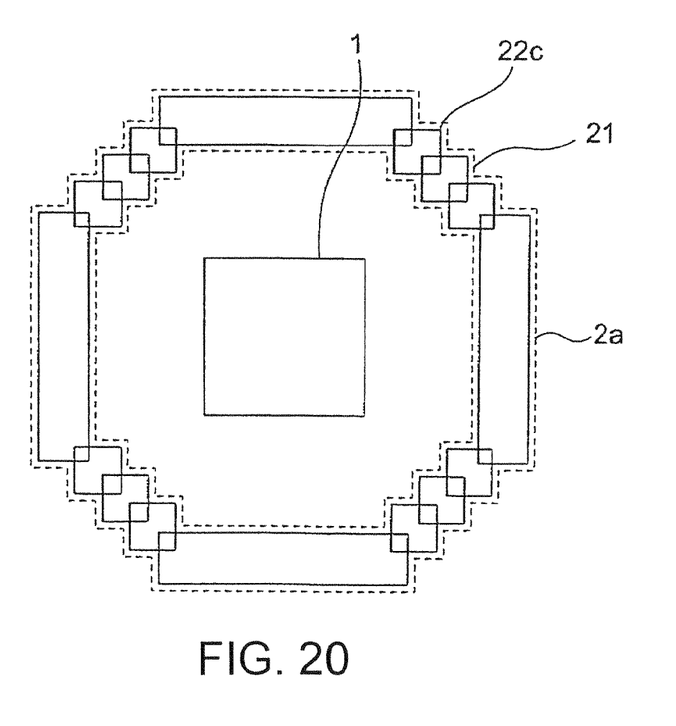
FIG. 20 is a plan view of a hole pattern and an auxiliary pattern for illustrating still another drawing data generation method.

FIG. 20 shows an auxiliary pattern 2a approximated by still another drawing data generation method. As shown in FIG. 20, the oblique pattern 21 contained in the auxiliary pattern 2a is approximated by a plurality of rectangular patterns 22c arranged to overlap each other at their corners. In this drawing data as well, correction is made in consideration of the process bias, and moreover the oblique pattern 21 is approximated by the rectangular patterns 22c instead of fine shapes. As a result, the increase of the number of rectangles can be prevented and the period of time required for the mask drawing can be shortened.

Although the description of the embodiment above has been made in terms of the transmission type mask for use in ArF excimer laser exposure, the invention is not limited to this, and is applicable to other wavelengths and other types of masks (e.g. reflection type masks). Although dry etching with chlorine gas is used in the step shown in FIG. 3F, the invention is not limited to this, and the shielding film 13 may be selectively removed with an aqueous solution containing cerium diammonium nitrate or the like.

Although only the process bias is taken into consideration for the drawing data of the mask shown in FIG. 20, the invention is not limited to this, and not only the process bias but other factors such as proximity effects of electron beam drawing and lens characteristics of the exposure device may be taken into consideration. If optical proximity correction (OPC) on the hole pattern 1 results in fine aliasing in the hole pattern 1, the number of rectangles may be reduced in the drawing data in the same manner as in the auxiliary pattern 2a described above, so that optimal dimensions can be obtained in the finished mask pattern. In this case, the correction in consideration of the process bias may be omitted.

Although the auxiliary patterns 2a and 2b shown in FIGS. 18 to 20 are of an octagonal shape, the invention is not limited to this, and the drawing data generation method described above is applicable to patterns assuming any other polygonal shape as long as it surrounds at least two sides of the hole pattern 1 and contains an oblique pattern.

Although in the description of the embodiment above, the calculation is made on the assumption that the transmittance of the shielding regions 4a and 4b is 0%, the transmittance affects little on the light intensity distribution on the wafer and the transmittance may take any value other than 0%, as long as it can be considered as a shielding region. For example, the transmittance may be about 0.1%. In conventional masks, a mask transmittance is represented by a logarithm of transmission intensity referred to as optical density (OD: The base-10 logarithm of the intensity transmittance), and a transmittance in the range of OD 3 to OD 5 is used. Since the shielding regions 4a and 4b of the embodiment above are not close to the hole pattern 1, they are not required to have a perfect light shielding property unlike the conventional masks, and a transmittance of about 1% does not affect the exposure characteristics of the hole pattern 1. However, it is preferable to use common shielding films in fabrication of masks. Therefore, the transmittance of the shielding regions 4a and 4b where the shielding film 13 overlaps with the halftone film 12 may be set to about 0.001% (OD 5).

The exposure mask according to the present invention may be embodied as follows. The transmittance of the translucent region 3 is preferably in the range of 10 to 14%, and for example is about 12%. This reduces variation of size of a pattern formed on the wafer with respect to the focal depth in comparison with a case in which the transmittance is 6% or 20%, for example. Consequently, the pattern can be formed more stably on the wafer while improving the focal depth.

The transmittance of the shielding regions 4a and 4b is 0.1% or less. In this case, the light intensity distribution on the wafer is affected little and the shielding regions 4a and 4b can be considered as practically effective shielding regions.

The auxiliary patterns 2a and 2b are arranged to surround the rectangular pattern 1. In this case, the amplitude distribution of mask transmitted light with respect to a distance from the center of the rectangular pattern is substantially the same in any direction. Accordingly, the focal depth can be improved in all the sides of the rectangular pattern.

The oblique pattern 21 is approximated by a plurality of square patterns 22a. This makes it possible to reduce the number of rectangle and hence to shorten the period of time required for drawing, in comparison with a case in which an oblique pattern is drawn with the use of fine rectangles.

The pattern formation method according to the present invention may be embodied as follows. The exposure light is linearly polarized light. In this case, the use of linearly polarized light improves the exposure characteristics of patterns.

Exposure light is obtained from the secondary light source providing orbicular zone illumination, and the polarization direction of linearly polarized light is perpendicular to a radial direction of the orbicular zone illumination. In this case, the linearly polarized light polarized perpendicularly to the radial direction of the orbicular zone illumination is used in addition to the orbicular zone illumination having no pattern direction dependency and thus having high versatility in the oblique incidence illumination method. Accordingly, the pattern exposure characteristics can be improved even further.

The exposure mask fabrication method according to the present invention may be embodied as follows. Dimensional shift occurs due to regression of the resist during dry etching. Therefore, drawing data is generated in consideration of process bias, and a pattern with a target dimension can be formed in the mask by performing mask drawing based on the drawing data thus generated.

In the exposure mask according to the present invention, the translucent region is formed around the rectangular pattern, and the shielding region is formed around the outer periphery of the auxiliary pattern. As a result, the transmittance varies according to a distance from the center of the rectangular pattern, and thus the amplitude distribution of mask transmitted light can be approximated to the so-called Bessel function. This makes it possible to improve the focal depth even if the rectangular pattern is an isolated pattern generating no diffracted light.

According to the pattern formation method of the present invention, the mask is illuminated with exposure light by an oblique incidence illumination method, whereby a sufficient focal depth is obtained, and even a mask pattern having a fine dimension can be formed stably on a wafer.

According to the exposure mask fabrication method of the present invention, an oblique pattern contained in the auxiliary pattern is approximated by a plurality of square patters having a dimension determined in consideration of process bias. This makes it possible to reduce the number of rectangles required for drawing the auxiliary pattern, and to reduce the time required for the mask drawing.

According to the exposure mask fabrication method of the present invention, further, the auxiliary pattern is arranged between the shielding region and the translucent region, whereby a larger margin can be ensured for formation of a mask during mask drawing for formation of the translucent region.

Although the present invention has been described based its preferred embodiments, the exposure mask, the pattern formation method, and the exposure mask manufacturing method of the invention are not limited to the embodiments described above. Various modifications and variations are possible in the embodiments described above, and all these modifications and variations are intended to be within the scope of the present invention.

What is claimed is:

1. An exposure mask, comprising:
    a rectangular pattern including a transparent region having a dimension equal to or greater than a critical resolution of exposure light;
    an auxiliary pattern arranged around the rectangular pattern and including a transparent region having a dimension smaller than the critical resolution;
    a translucent region arranged between the rectangular pattern and the auxiliary pattern for shifting a phase of light transmitted through the rectangular pattern and the octagonal auxiliary pattern to an opposite phase; and
    a shielding region arranged around the auxiliary pattern.

2. The exposure mask according to claim 1, wherein:
    the translucent region has a transmittance within a range of 10 to 14%.

3. The exposure mask according to claim 1, wherein:
    the shielding region has a transmittance of 0.1% or less.

4. The exposure mask according to claim 1, further comprising:
    another octagonal auxiliary pattern located in the shielding region and arranged around the auxiliary pattern.

5. A pattern formation method for forming a pattern on a wafer by performing exposure using the exposure mask according to claim 1, wherein:
    the exposure mask is illuminated with exposure light by using an oblique incidence illumination method.

6. The pattern formation method according to claim 5, wherein:
    the exposure light is linearly polarized light.

7. The pattern formation method according to claim 6, wherein:
    the exposure light is obtained from a secondary light source providing orbicular zone illumination, and
    a polarization direction of the linearly polarized light is perpendicular to a radial direction of the orbicular zone illumination.

8. An exposure mask fabrication method for fabricating the exposure mask according to claim 1, comprising:
    forming a translucent film and a shielding film on a transparent substrate;
    forming the rectangular pattern and the octagonal auxiliary pattern by masking the translucent region and the shielding region to selectively remove the translucent film and the shielding film; and
    forming the translucent region by masking the shielding region to selectively remove only the shielding film from the translucent film and the shielding film left unremoved in the translucent region.

* * * * *